United States Patent
Cao

(10) Patent No.: US 6,746,885 B2
(45) Date of Patent: Jun. 8, 2004

(54) METHOD FOR MAKING A SEMICONDUCTOR LIGHT SOURCE

(76) Inventor: Densen Cao, 2851 E. Durban Rd., Sandy, UT (US) 84109

( * ) Notice: Subject to any disclaimer, the term of this patent is extended or adjusted under 35 U.S.C. 154(b) by 33 days.

(21) Appl. No.: 09/938,875

(22) Filed: Aug. 24, 2001

(65) Prior Publication Data

US 2003/0040200 A1 Feb. 27, 2003

(51) Int. Cl.$^7$ .................. H01L 21/00; H01L 21/48
(52) U.S. Cl. .................. 438/26; 438/29; 438/116; 438/122
(58) Field of Search .................. 362/800; 438/22, 438/26, 29, 106, 107, 116, 118, 122, 121, 125, 800; 174/52.1, 52.3, 260

(56) References Cited

U.S. PATENT DOCUMENTS

| | | | |
|---|---|---|---|
| 4,675,575 A | 6/1987 | Smith et al. ............... 315/185 |
| 4,727,289 A | 2/1988 | Uchida .................... 315/71 |
| 5,160,200 A | 11/1992 | Cheselske ................ 362/249 |
| 5,463,280 A | 10/1995 | Johnson ................... 315/187 |
| 5,575,459 A | 11/1996 | Anderson ................. 362/240 |
| 5,655,830 A | 8/1997 | Ruskouski ................ 362/240 |
| 5,688,042 A | 11/1997 | Madadi et al. ............ 362/240 |
| 5,765,940 A | * 6/1998 | Levy et al. ............... 362/240 |
| 5,806,965 A | 9/1998 | Deese ..................... 362/249 |
| 5,813,752 A | * 9/1998 | Singer et al. ............ 362/293 |
| 5,890,794 A | 4/1999 | Abtahi et al. ............ 362/294 |
| 5,941,626 A | 8/1999 | Yamuro ................... 362/246 |
| 5,947,588 A | 9/1999 | Huang .................... 362/235 |
| 5,982,092 A | 11/1999 | Chen ...................... 313/512 |
| 6,045,240 A | * 4/2000 | Hochstein ................. 362/294 |
| 6,149,283 A | * 11/2000 | Conway et al. ........... 362/236 |
| 6,220,722 B1 | 4/2001 | Begemann ................ 362/231 |
| 6,499,860 B2 | * 12/2002 | Begemann ................ 362/230 |
| 6,502,952 B1 | * 1/2003 | Hartley ................... 362/184 |
| 6,561,680 B1 | * 5/2003 | Shih ...................... 362/294 |
| 6,577,073 B2 | * 6/2003 | Shimizu et al. .......... 315/246 |
| 6,580,228 B1 | * 6/2003 | Chen et al. ............. 315/185 R |

OTHER PUBLICATIONS

Schewber, Bill, "LEDs move from indication to illumination", EDN magazine (Aug. 2, 2001) pp. 75, 76, 78, 80, and 82.

* cited by examiner

Primary Examiner—Evan Pert
Assistant Examiner—Scott B. Geyer
(74) Attorney, Agent, or Firm—Daniel P. McCarthy; Parsons Behle & Latimer

(57) ABSTRACT

A method for making a semiconductor light source for illuminating a physical space has been invented. In various embodiments of the invention, a semiconductor such as a LED chip, laser chip, LED chip array, laser array, an array of chips, or a VCSEL chip is mounted on a heat sink. The heat sink may have multiple panels for mounting chips in various orientations. The chips may be mounted directly to a primary heat sink which is in turn mounted to a multi-panel secondary heat sink. A TE cooler and air circulation may be provided to enhance heat dissipation. An AC/DC converter may be included in the light source fitting.

22 Claims, 16 Drawing Sheets

METHOD FOR MAKING A SEMICONDUCTOR LIGHT SOURCE

BACKGROUND OF INVENTION

The invention relates to the field of light sources and illumination devices. More particularly, the invention relates to semiconductor light sources and illumination devices useful for providing visible light in order to partially or fully illuminate a space occupied by or viewed by humans, such as residential space, commercial space, outdoor space, the interior or exterior of a vehicle, etc.

In the prior art, light emitting diodes ("LED's") and other semiconductor light sources were traditionally used for panel displays (such as laptop computer screens), signal lighting, and other instrumentation purposes. ("LEDs") are desirable because they are a high efficiency light source that uses substantially less energy and creates less heat than typical prior art light sources such as incandescent and halogen lights. Prior art semiconductor light sources have not been successfully and economically used to illuminate physical spaces. Additionally, in the prior art, ("LED's") were typically individually packaged in a module, either with or without a focus dome on the module. Typical prior art LED modules lack high light intensity due to the size of the LED chips used. Further, arranging a sufficient number of prior art LED modules to generate high light intensity, such as use of a stack, lamp or array, took an excessive amount of physical space and created unmanageable amounts of heat. Consequently, in the prior art, LED's and other semiconductor light sources were not suitable for replacing the traditional tungsten light bulbs.

U.S. Pat. No. 5,941,626 discloses a long light emitting apparatus that uses a plurality of LED lamps (modules) connected in series. The LED modules are spaced apart and appear to be intended for decorative use, such as on street lamp poles and on Christmas trees.

U.S. Pat. No. 5,160,200 discloses a wedge-base LED bulb housing. The patent depicts a plurality of separate LED modules electrically connected to a wedge base.

U.S. Pat. No. 4,675,575 discloses light-emitting diode assemblies such as a mono-color or bi-color light string system. Each LED is in an envelope with light conducting optical spheres for light transmission and dispersion. The LED string system appears adapted for decorative use, such as for lighting Christmas trees.

A distinct need is felt in the prior art for a semiconductor light source for use in illuminating a space with single color light in the visible range and which can efficiently dissipate the heat that they produce. Presently, that application is served by incandescent and fluorescent lights which have high energy consumption, high heat generation, and short useful life compared to the invented semiconductor light sources.

SUMMARY OF INVENTION

It is an object of some embodiments of the invention to provide a semiconductor light source capable of illuminating a space with visible light. These and other objects of various embodiments of the invention will become apparent to persons of ordinary skill in the art upon reading the specification, viewing the appended drawings, and reading the claims.

DETAILED DESCRIPTION

Figure 1:
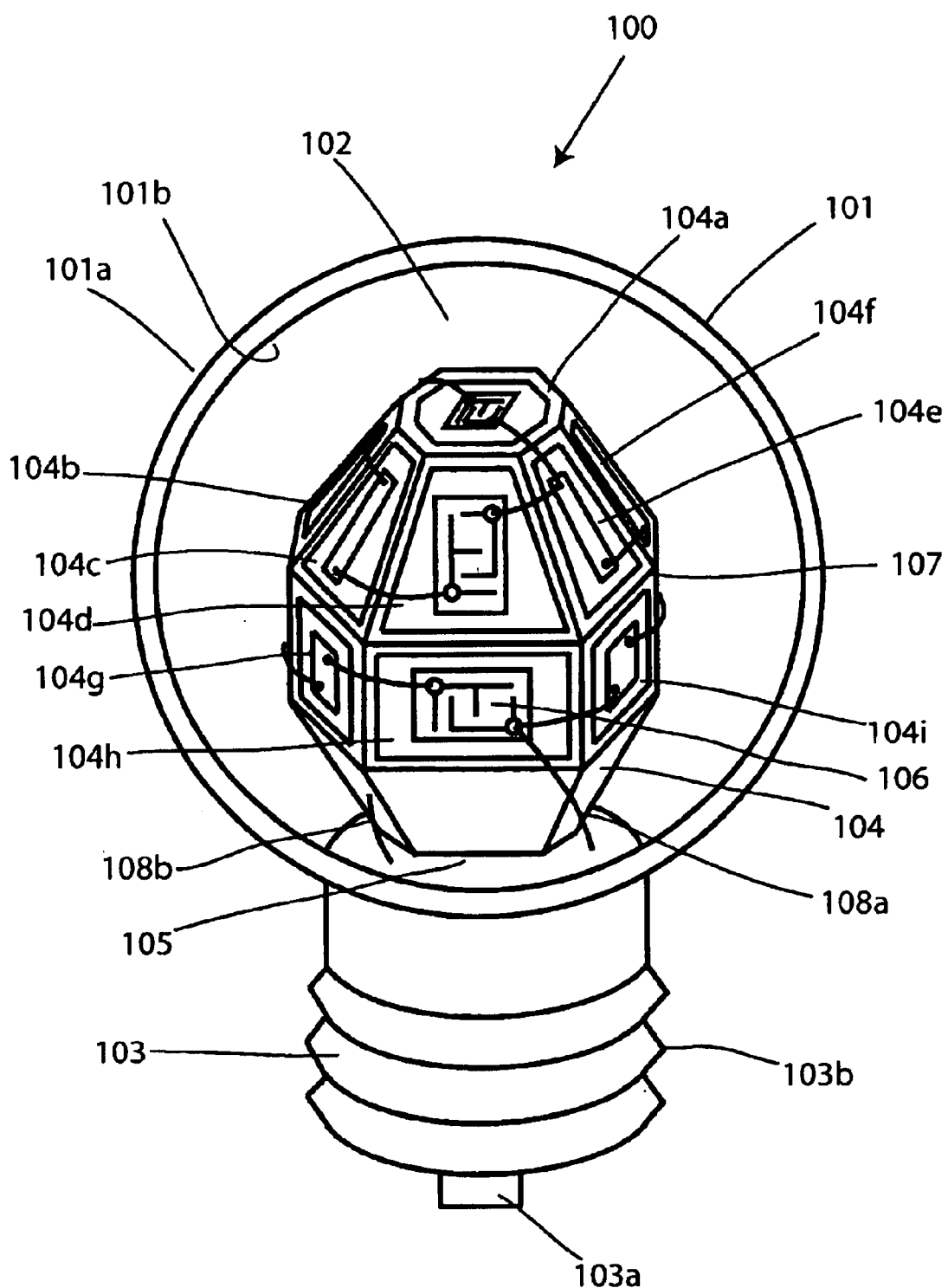
FIG. 1 depicts a semiconductor light source of one embodiment of the invention using a high power chip or array arrangement.

Referring to FIG. 1, one embodiment of the invention is depicted. In this embodiment of the invention, a semiconductor light source 100 is depicted. The light source 100 includes a traditional bulb-shaped enclosure 101. The enclosure 101 may be of any desired shape, including spherical, cylindrical, elliptical, domed, square, n-sided where n is an integer, or otherwise. The enclosure may be made from any desired light transparent or translucent materials, including glass, plastic, polycarbonate, and other light transparent materials.

The enclosure 101 has an exterior surface 101a and an interior surface 101b. The exterior surface 101a may be smooth and glossy, matte, or another finish or texture. The exterior surface 101a may be coated or painted with desired materials. The interior surface 101b may optionally include an appropriate coating, such as a luminous powder coating. Examples of luminous powder coating that may be used in the invention include YAG: Ce or other phosphor powders or coatings. For example, if the light source uses blue LED"s to generate light, but it is desired to illuminate a room with white light, the interior surface 101b maybe covered with a phosphor coating to convert blue light into white light. Any wavelength-modifying coating such as phosphor or another coating may be used. In some preferred embodiments of the invention, it is intended to convert light emitted by a semiconductor chip in the wavelength range of about 200 to about 700 nm. to white light.

The enclosure 101 encloses an interior volume 102 which may be a vacuum, or may contain a gas such as ordinary air, an inert gas such as argon or nitrogen, or any other desired gas. In some embodiments of the invention, a gas will be included within the interior volume 102 for the purpose of avoiding oxidation of the heat sink and the semiconductor.

The enclosure 101 may be mounted to a support 105. The support 105 may be a separate component or may be integral with the base 103. The base 103 may be configured as a fitting or connector for use in a desired light socket, such as a traditional light socket. In such case, the base 103 would also include electrodes 103a and 103b for making electrical connection with a power source.

Located within the interior volume 102 is at least one heat sink 104. The heat sink 104 may be of any desired shape, depending on the application. As depicted, the heat sink 104 has a generally flat or planar top 104a, and a plurality of generally flat or planar panels or compartment 104b, 104c, 104d, 104e, 104f, 104g, 104h, 104i, etc. each of which may host a single or an array of semiconductor devices capable of producing light. The heat sink 104 may be shaped otherwise, with curved or rounded sides.

If the heat sink 104 may be mounted on a support 105, the support 105 may be designed in order to place the heat sink in the most desirable position within the interior volume 102 so that semiconductors located on the heat sink may emit light that will be transmitted in a diffuse or focused pattern through the enclosure 101.

Mounted on the heat sink 104 are at least one semiconductor device 106. The semiconductor device(s) 106 may be arranged in this embodiment of the invention to transmit light in all directions except through the base 103, or in a manner to direct light in a specific direction. The semiconductor devices may be any semiconductor devices capable of emitting light, such as LED's, LED arrays, VCSEL's, VCSEL arrays, photon recycling devices that cause a monochromatic chip to emit white light, and others.

The semiconductor devices 106 are electrically connected to each other via electrical connections 107. Lead wires 108a and 108b are used to provide the semiconductor devices 106 with electrical power. As desired, the heat sink may serve as a positive or negative electrical connection for the semiconductor devices.

The heat sink 104 may be any material capable of conducting heat away from the semiconductor devices. Examples of suitable materials include copper, aluminum, silicon carbide, boron nitride and others known to have a high coeffecient of thermal conductivity.

In order to provide suitable electrical power to the semiconductor devices, an AC/DC converter (not shown in this fixture) is utilized. This will permit the invented semiconductor light source to be powered by 110 V. or 220 V. AC power found in homes and businesses throughout the world. The AC/DC converter may be located in the base 103 or in another location.

In alternative embodiments of the invention, each semiconductor device may have its own individual heat sink, or two or more semiconductor devices may be located on the same heat sink. In some embodiments of the invention, the base may also serve as a heat sink, eliminating the need for a separate heat ink and thereby reducing cost.

Figure 2:
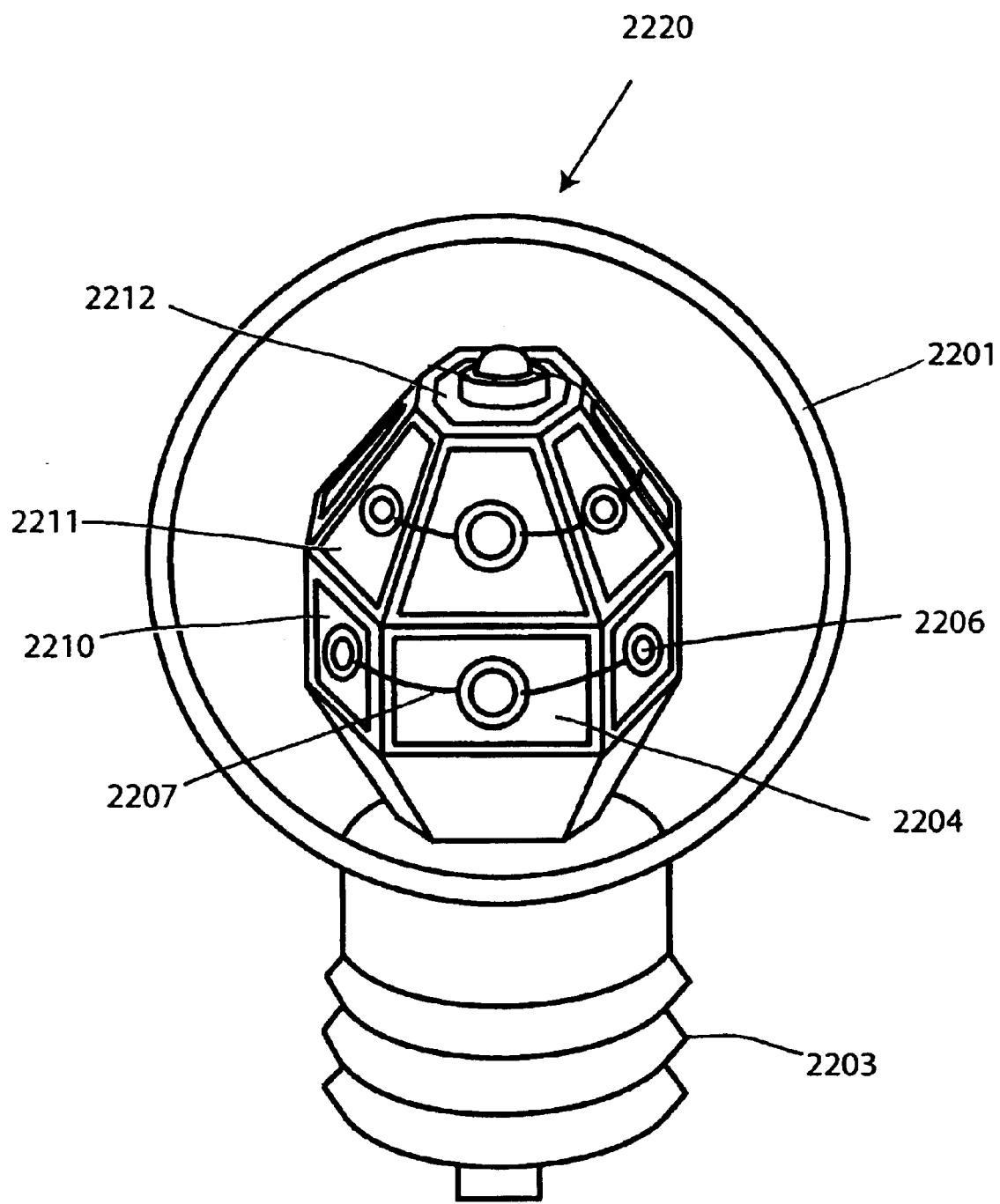
FIG. 2 depicts a semiconductor light source of one embodiment of the invention using high power surface mount LED chip modules or lamps.

Referring to FIG. 2, a semiconductor device 2220 in enclosure 2201 can be arranged to accommodate high power surface LED"s. "High power" LED"s means that the light output from each LED module is greater than 40 milliwatts. "Surface mount" LED"s are LED"s mounted directly on a heat sink, or other surface, in contrast with traditional LED lamps which have ordinary electrical leads for wiring and must be separately held in place. High power surface mount LED"s are described in detail later in this document.

When high power LED"s are used, all the components are the same as in FIG. 1 except that a high power LED 2206 is used. It can be seen that the LED"s 2206 are electrically connected with electrical connectors 2207 and are located on a heat sink 2204. The heat sink 2204 has a plurality of heat sink faces 2210, 2211 and 2212 which are each generally planar and are arranged in angular orientation with each other in order to cause light from the LED"s to be dispersed around a space to be illuminated. The heat sink faces can be oriented with respect to each other at any desired angle, but 45 degree angles are depicted in the figure so that face 2210 is perpendicular to face 2212. A standard base 2203 is provided.

Any of the semiconductor light sources described below and others may be used in embodiments of the invention.

Figure 3A:
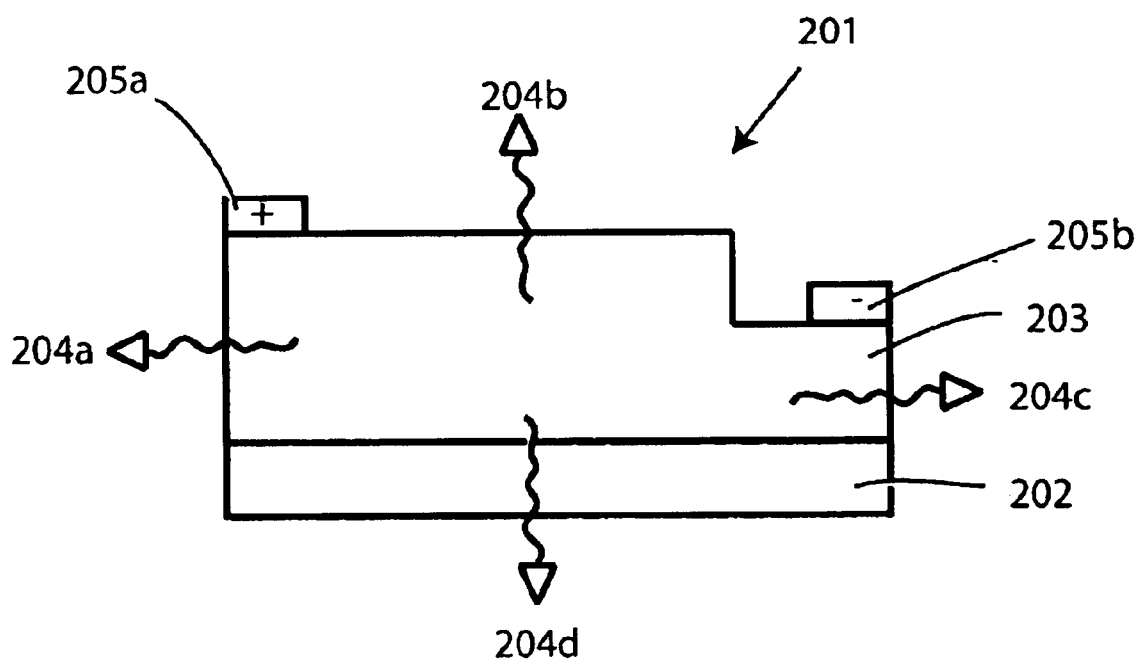
FIG. 3a depicts a LED with an insulating substrate.

FIG. 3a depicts an LED chip with an insulating substrate 201. The substrate 202 may be an appropriate material on which a semiconductor may be grown, such as sapphire, gallium arsenide, silicon carbide, gallium phosphorous, gallium nitride and others. The substrate 202 will also in this embodiment be electrically insulative. The semiconductor material 203 will emit light in all directions as indicated by arrows 204a, 204b, 204c and 204d. Positive 205a and negative 205b electrodes are provided for powering the chip.

Figure 3C:
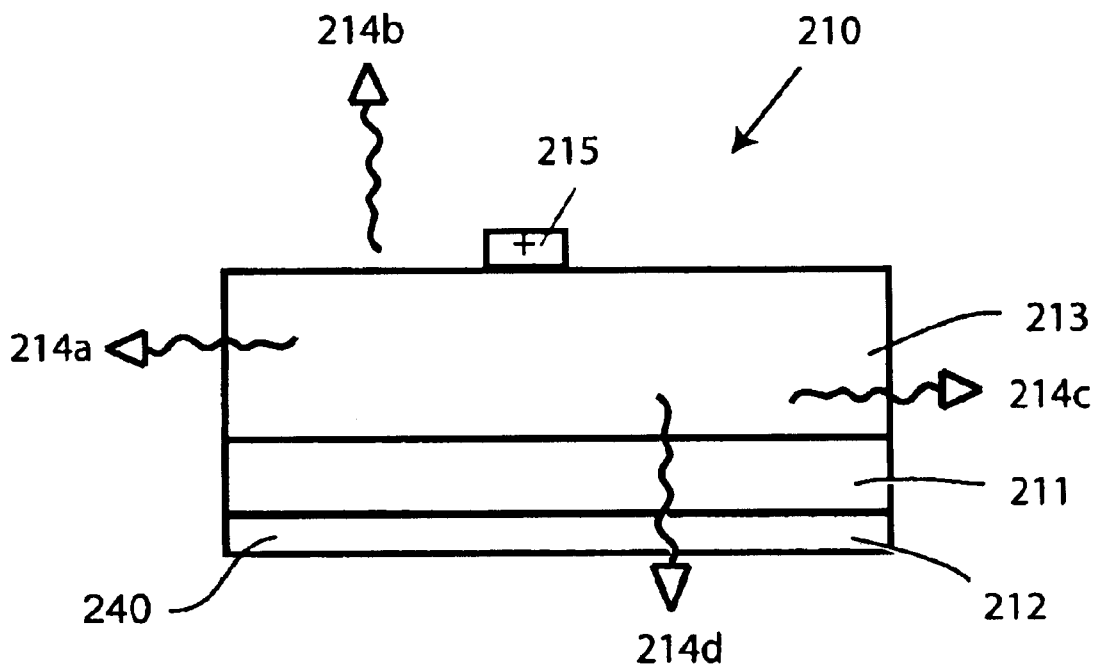
FIG. 3c depicts a LED with a conducting substrate.
Figure 3B:
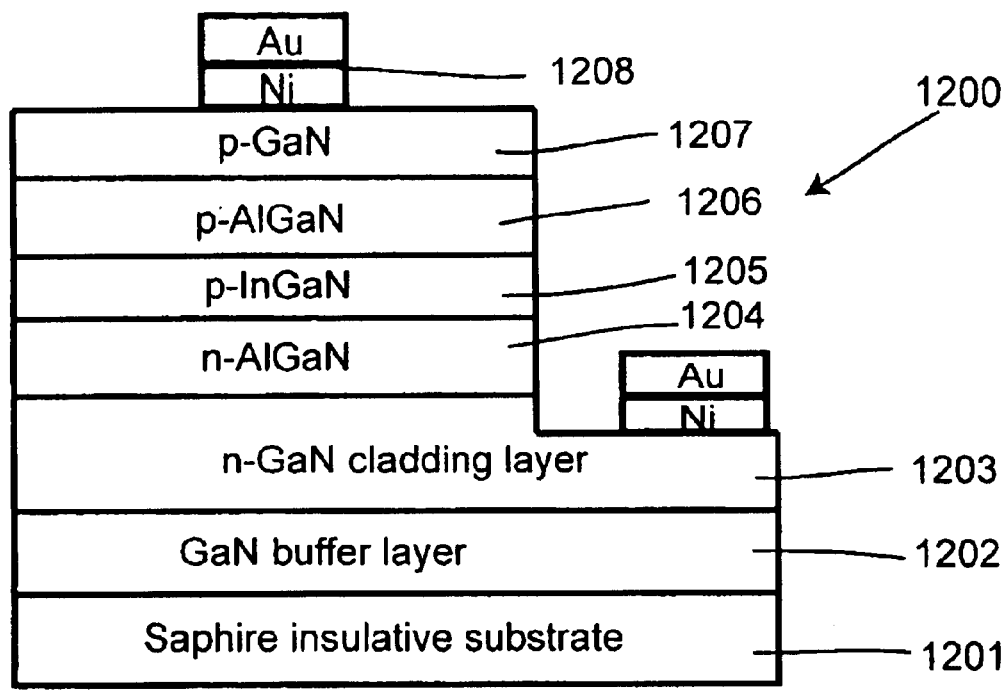
FIG. 3b depicts a detailed view of a LED structure on a sapphire substrate.

FIG. 3b depicts an example of epitaxial layer configuration for the LED of FIG. 3a. A light emitting diode on an electrically insulative substrate 1200 is depicted. The LED includes an electrically insulative substrate such as sapphire 1201. The substrate serves as a carrier, pad or platform on which to grow the chip's epitaxial layers. The first layer placed on the substrate 1201 is a buffer layer 1202, in this case a GaN buffer layer. Use of a buffer layer reduces defects in the chip which would otherwise arise due to differences in material properties between the epitaxial layers and the substrate. Then a conductive layer 1203 is provided, such as n-GaN. This layer acts as a connector for a negative electrode. Then a cladding layer 1204, such as n-AlGaN, is provided. Cladding layers serve to confine the electrons as they jump from a conduction band to valance and give up energy that converts to light. An active layer 1205 p-lnGaN is then provided where electrons jump from a conduction band to valance and emit energy which converts to light. On the active layer 1205, another cladding layer 1206, such as p-AlGaN is provided that also serves to confine electrons. A contact layer 1207 such as p+-GaN is provided that is doped for Ohmic contact. The contact layer 1207 has a positive electrode 1208 mounted on it, in this case an electrode that has a mount side on the contact layer 1207 that is Ni and an electrode face that is Au. A similar negative electrode is provide on a shelf of the first cladding layer 1203.

FIG. 3c depicts an LED with a conducting substrate 210. The substrate 211 must be an electrically conductive material on which a semiconductor ship may be grown, such as gallium arsenide, silicon carbide, gallium phosphorous, gallium nitride and others. A portion of the substrate 212 will serve as an electrode for powering the chip, in this case a negative electrode. The semiconductor material 213 will emit light in all directions as indicated by arrows 214a, 214b, 214c and 214d. A positive electrode 215 is provided, and the base 240 of the substrate 211 acts as a negative electrode. The base 240 is made of any conductive metal such as Au, Au/Ce, An/Zn and others.

Figure 3D:
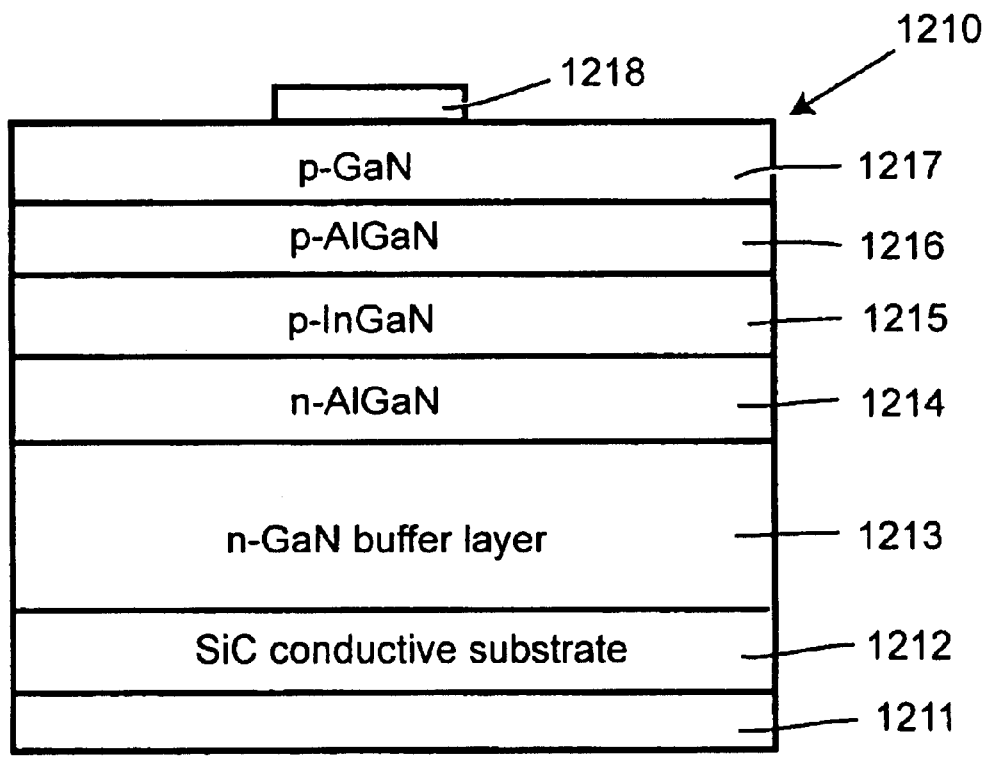
FIG. 3d depicts a detailed view of a LED structure on a sapphire substrate.

FIG. 3d depicts epitaxial layer configuration for the LED of FIG. 3c. A light emitting diode grown on an electrically conductive substrate 1210 is depicted. The LED includes an electrically conductive substrate such as SiC 1212. The substrate serves as a carrier, pad or platform on which to grow the chip"s epitaxial layers, and as a negative electrode in the chip. The first layer placed on the substrate 1212 is a buffer layer 1213, in this case a GaN buffer layer. Next, a cladding layer 1214 is provided, such as n-GaN. An active layer 1215 p-InGaN is provided where energy is converted to light. On the active layer 1215, another cladding layer 1216, such as p-AlGaN is provided. A contact layer 1217 such as p+-GaN that has a positive electrode 1218 mounted on it. A negative electrode 1211 is provided at the base of the chip.

Figure 3E:
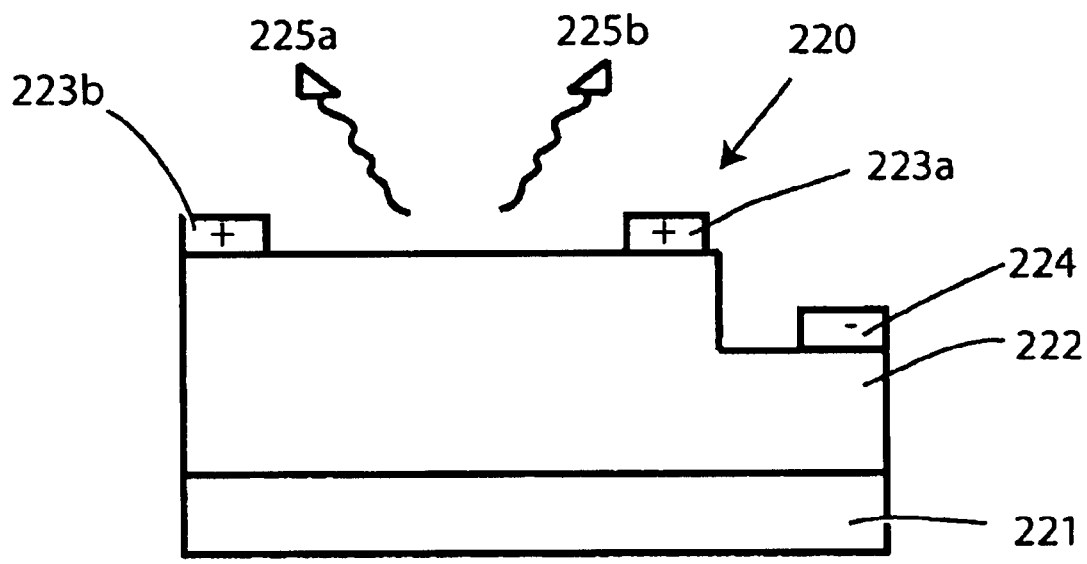
FIG. 3e depicts a VCSEL chip on an insulating substrate.

FIG. 3e depicts a VCSEL chip on an insulating substrate 220. The substrate 221 has a volume of semiconductor material 222 on it. Positive electrodes 223a and 223b and negative electrodes 224 are provided for powering the chip, and light is emitted from the chip in directions generally indicated by arrows 225a and 225b.

Figure 3G:
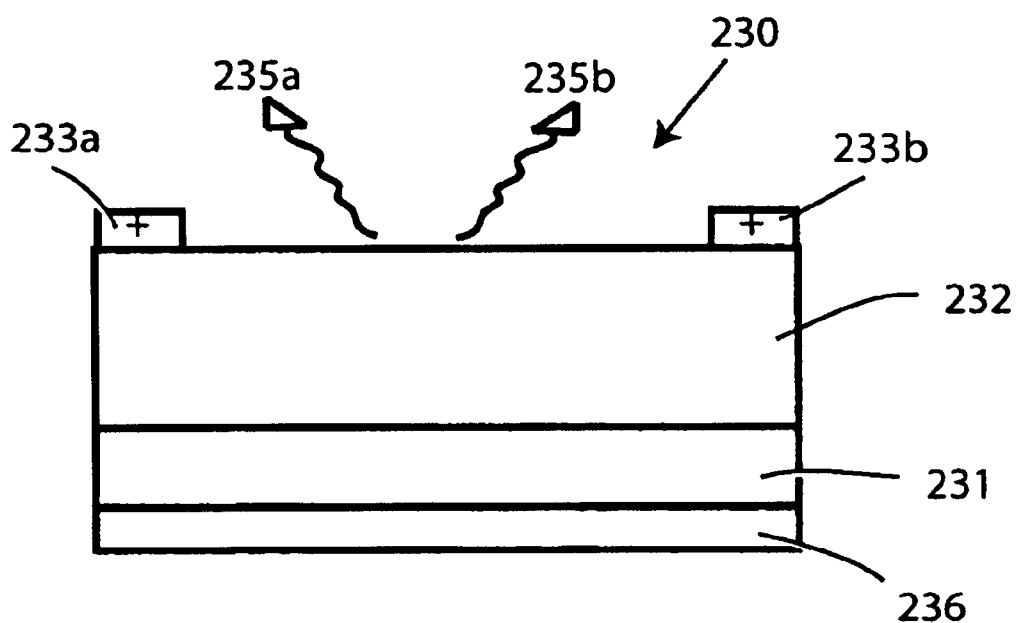
FIG. 3g depicts a VCSEL chip on a conductive substrate.
Figure 3F:
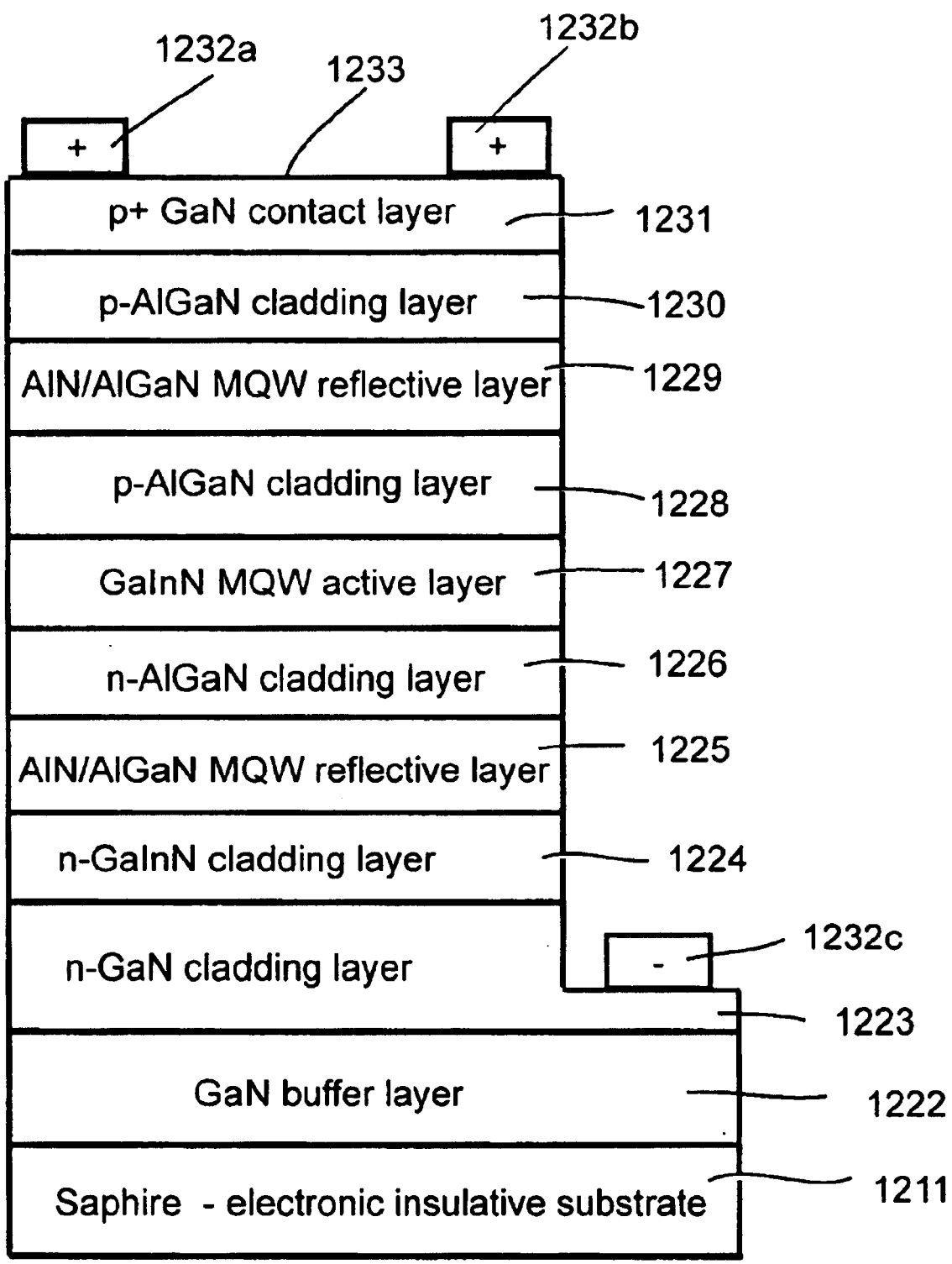
FIG. 3f depicts a detailed view of a VCSEL chip on a insulative substrate.

FIG. 3f depicts epitaxial layer configuration of the VCSEL chip of FIG. 3e with an electrically insulative substrate 1220. The chip 1220 includes a substrate 1221 that has electrically insulative properties such as sapphire. On top of the substrate 1221 there is a buffer layer 1222 such as GaN followed by a cladding layer and contact layer 1223 such as n-GaN. The cladding layer 1223 includes a negative electrode 1232c. Next, there is another cladding layer nGaInN 1224. A reflective layer AlN/AlGaN MQW (multiple quantum wells) 1225 is provided. A cladding layer 1226 n-AlGaN is interposed between the reflective layer 1225 and the active layer 1227 GaInN MQW. The active layer 1227 is followed by another cladding layer p-AlGaN 1228 which is followed by a second reflective layer 1229 AIN/AlGaN MQW. Light emitted from the active layer reflects between the two reflective layers until it reaches an appropriate energy level and then lases, emitting a laser beam of light. The second reflective layer 1229 is followed by a cladding layer p-AlGaN 1230 and a contact layer p+-GaN 1231. The contact layer may be ring-shaped with a window opening 1233 and has one or more positive electrodes 1232a and 1232b which are contact areas. The negative electrode is created on the n-GaN layer.

FIG. 3g depicts a VCSEL chip on a conductive substrate 230. The substrate 231 has a volume of semiconductor material 232 on it. Positive electrodes 233a and 233b are provided for powering the chip, and light is emitted from the chip in directions generally indicated by arrows 235a and 235b. The base 236 of the substrate 231 serves as a negative electrode.

Figure 3H:
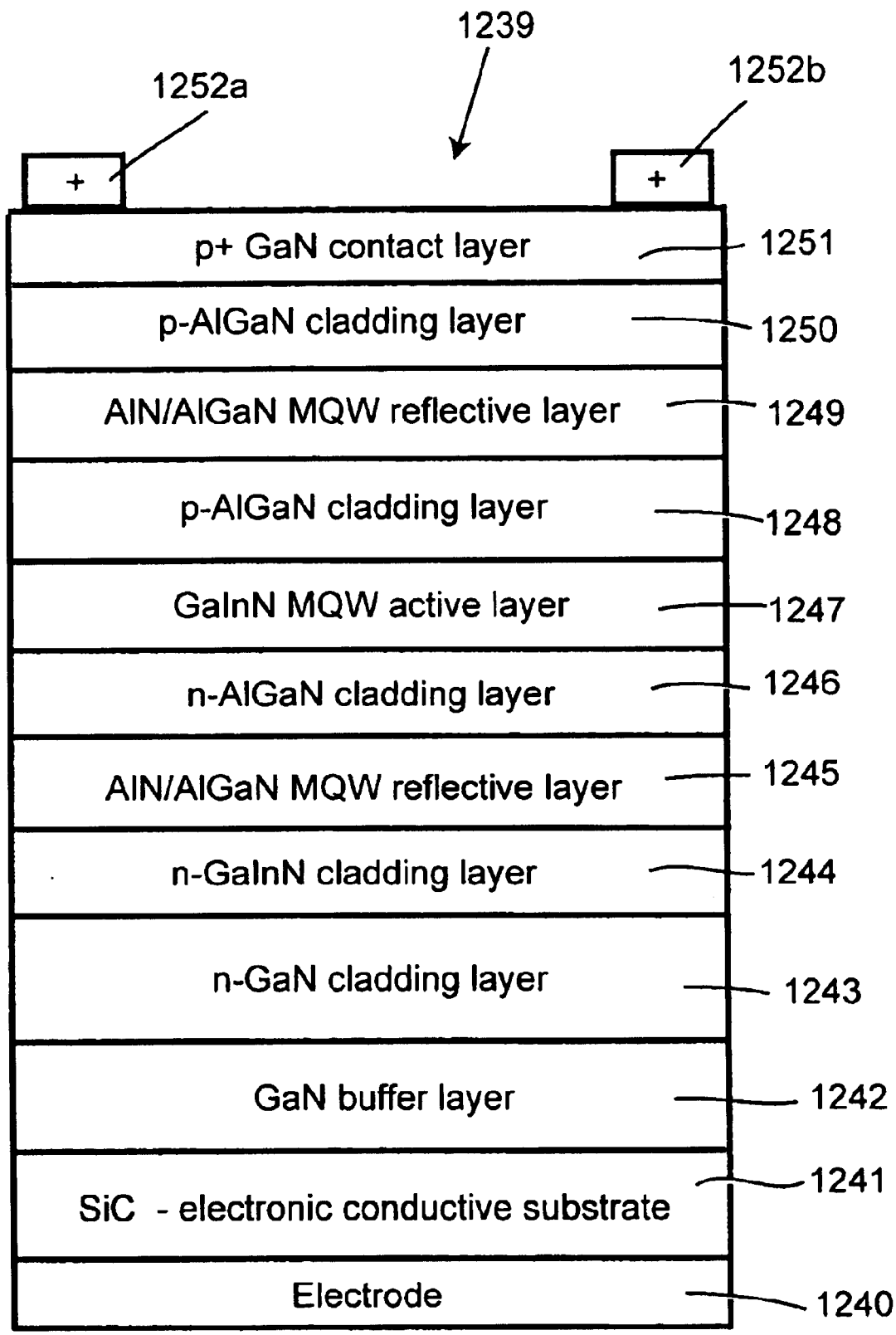
FIG. 3h depicts a detailed view of a VCSEL chip in a conductive substrate.

FIG. 3h depicts epitaxial layer configuration of a VOSEL chip with an electrically conductive substrate 1239 such as that of FIG. 3g. The chip 1239 includes a substrate 1241 that has electrically conductive properties such as SiC. The underside of the substrate 1241 has an electrode 1240. On top of the substrate 1241 there is a buffer layer 1242 such as GaN followed by a cladding layer 1243 such as n-GaN. Next, there is another cladding layer NGaInN 1244. A reflective layer using AlN/AlGaN MQW (multiple quantum wells) 1245 is then provided. A cladding layer 1246 n-AlGaN is interposed between the first reflective layer 1245 and the active layer 1247 GaInN MQW. The active layer 1247 is followed by another cladding layer p-AlGaN 1248 which is followed by a second reflective layer 1429 AlN/AlGaN MOW. The second reflective layer 1249 is followed by a cladding layer p-AlGaN 1250 and a contact layer p+-GaN 1251. The contact layer may have one or more positive electrodes 1252a and 1252b mounted on it.

Figure 4A:
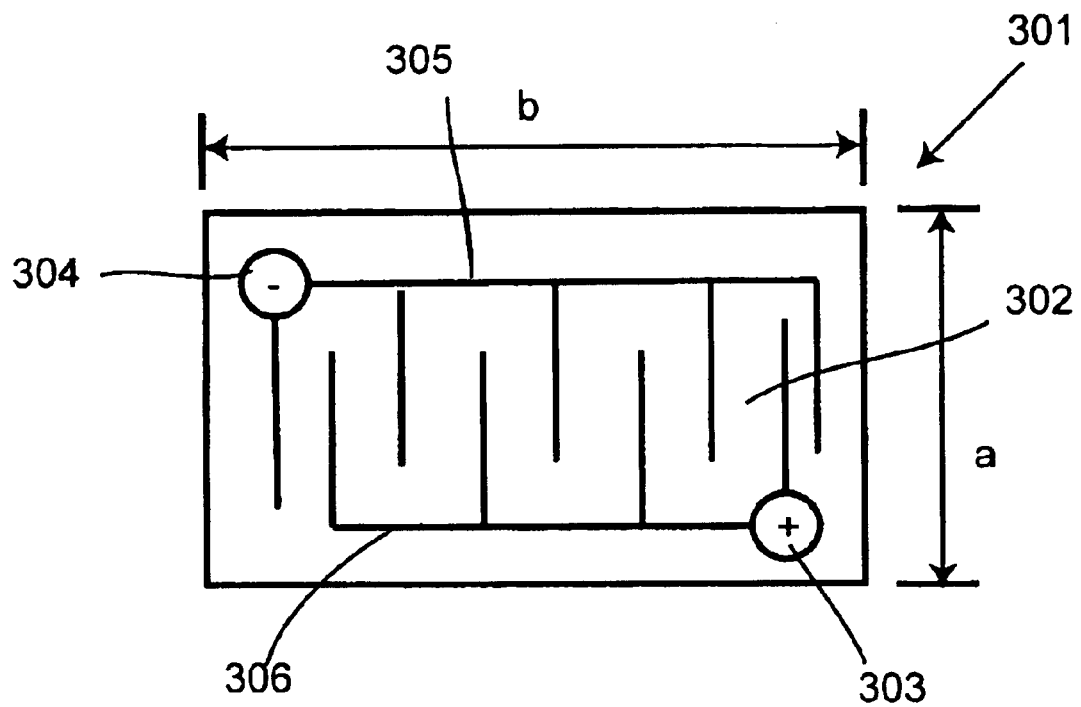
FIG. 4a depicts a top view of a LED array on a single chip with an insulating substrate.

FIG. 4a depicts a top view of an LED array on a single chip with a size a×b on an insulating substrate 301. Each of sizes a and b is greater than 300 micro meters. Semiconductor materials 302 are located on an electrically insulative substrate (not shown). Positive 303 and negative 304 pads are provided, each in electrical connection with its respective metal strip 305 and 306 arranged in a row and column formation (8 columns shown) to create the array and power the chip. This enables the LED to emit high power light from a single chip.

Figure 4B:
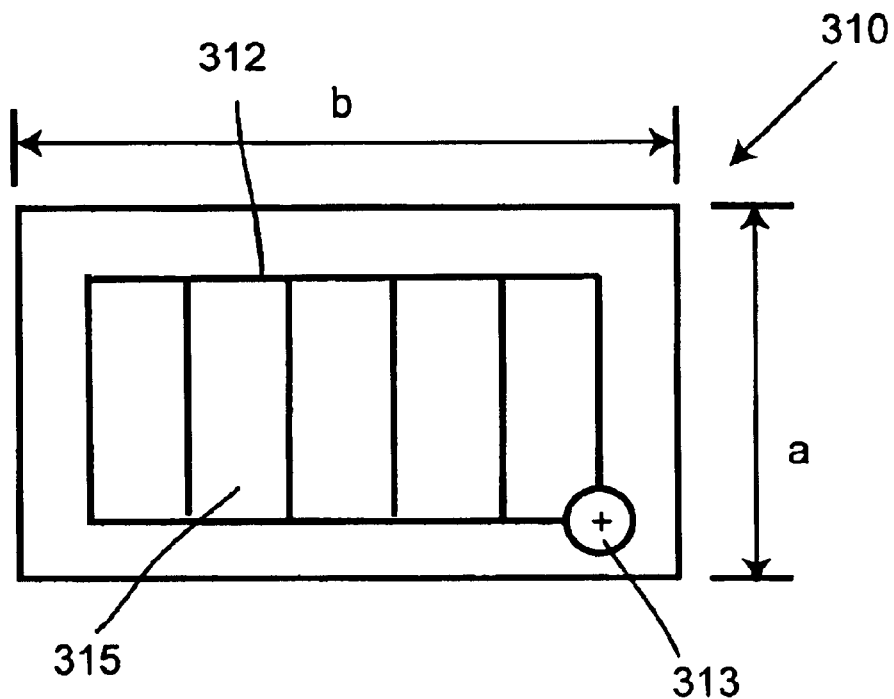
FIG. 4b depicts a top view of a LED array on a single chip with a conductive substrate.

FIG. 4b depicts a top view of an LED array on a single chip with a size a×b on a conductive substrate 310. Each of sizes a and b is greater than 300 micro meters. Semiconductor materials 312 are located on an electrically conductive substrate (not shown). Positive pad 313 is provided in electrical connection with a metal strip 315 arranged in an array formation to power the chip. The substrate 310 serves as the negative electrode in the embodiment depicted.

Figure 4C:
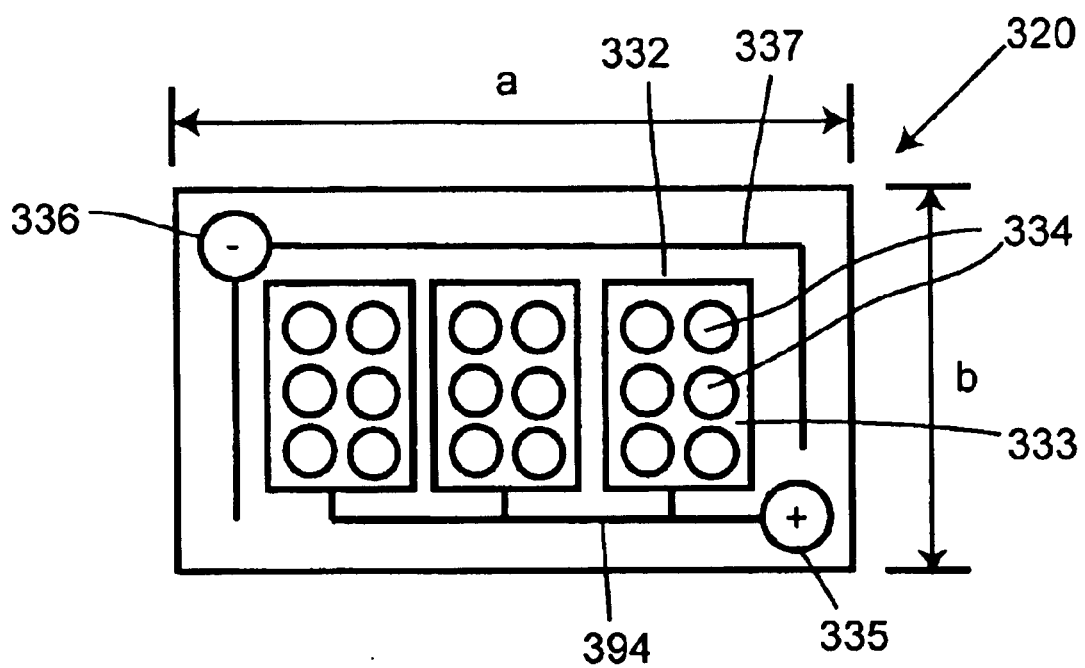
FIG. 4c depicts a top view of a VCSEL array on a single chip with an insulating substrate.

FIG. 4c depicts a top view of a VCSEL array on a single chip with a size a×b on an insulating substrate 320. Each of sizes a and b is greater than 300 micro meters. The chip 320 includes an electrically insulative substrate (not shown) on which a semiconductor material 332 is located covered by a panel 333. The panel 333 may be an appropriate conductive material such as Au/Ce, Au/Zn and others. The panel 333 has a plurality of windows 334 in it to permit light produced by the semiconductor material 332 to be emitted for use. The panel 333 is electrically connected to conductive metal strip 340 and to an electrode pad 335. A negative electrode pad 336 is also provided in electrical conduction with a metal strip 337 to power the chip.

Figure 4D:
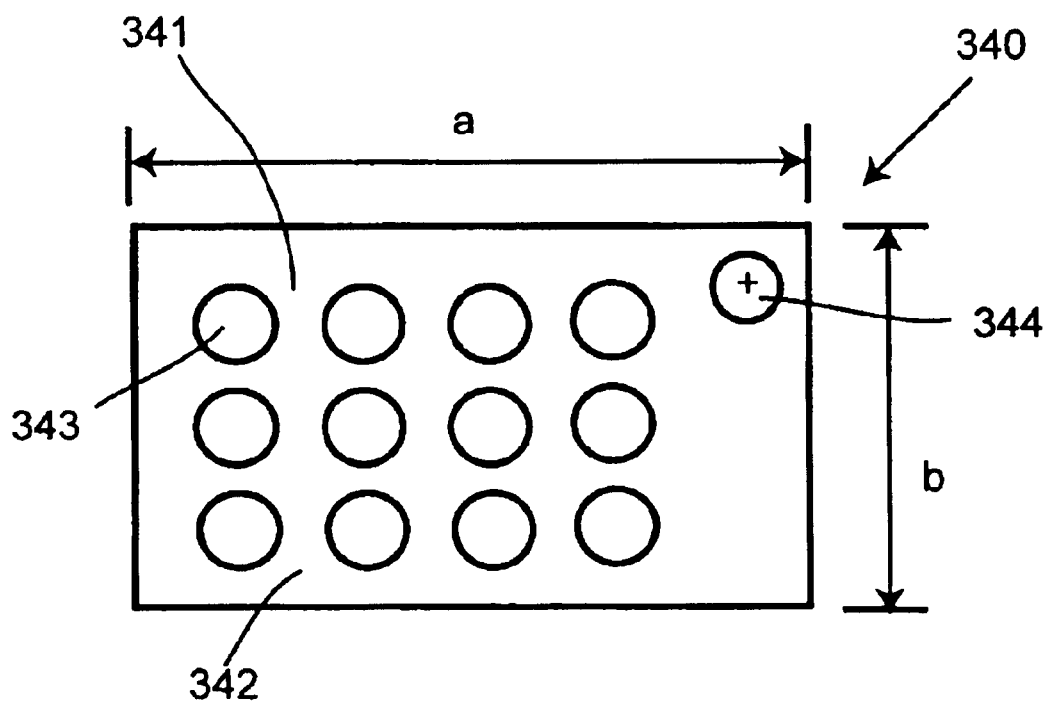
FIG. 4d depicts a top view of a VCSEL array on a single chip with a conductive substrate.

FIG. 4d depicts a top view of a VCSEL array on a single chip with a dimension a×b on a conductive substrate 340. Each of sizes a and b is greater than 300 micro meters. It includes a conductive substrate (not shown) on which a semiconductor material 341 is located. A conductive panel 342 overlays the semiconductor material 341. A plurality of windows 343 are provided in the panel 342 to allow light produced by the chip to escape for us. A positive electrode pad 344 is provided which in conjunction with the electrically conductive substrate serving as a negative electrode power the chip. A negative electrode is provided on the bottom of the chip 340.

Figure 5A:
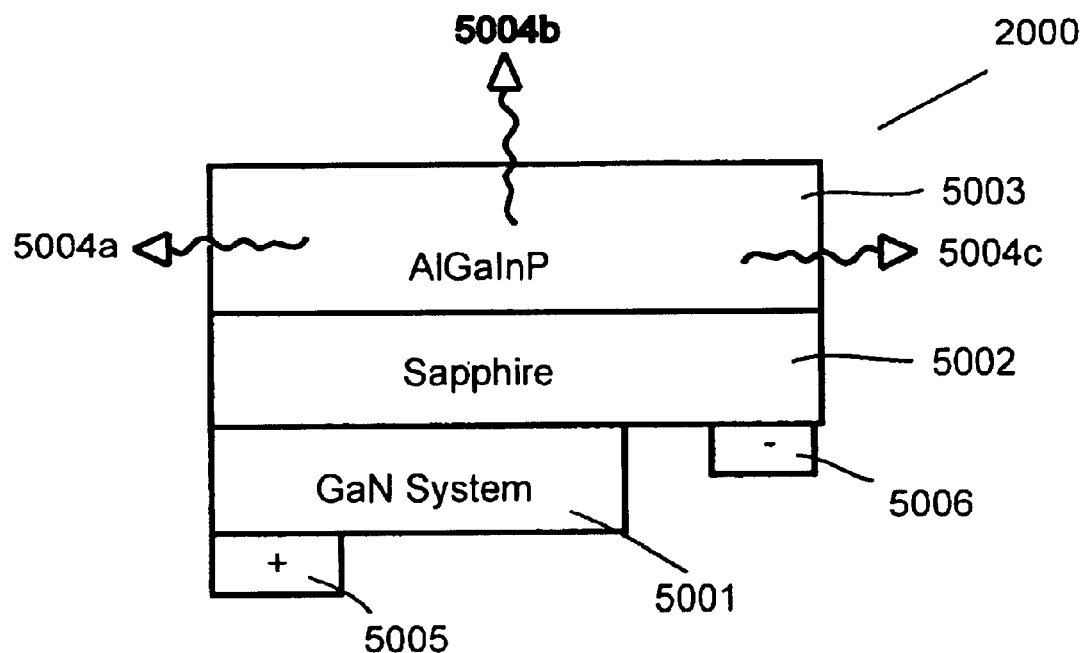
FIG. 5a depicts a semiconductor chip of the invention that emits single color light using a conversion layer.
Figure 5B:
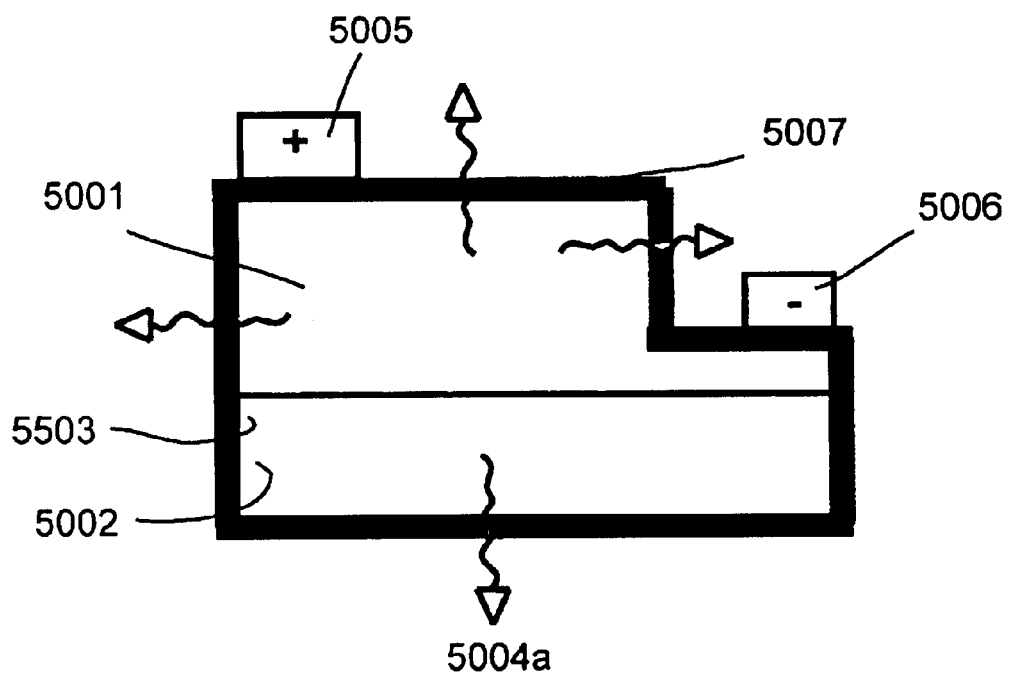
FIG. 5b depicts a semiconductor chip of the invention that emits single color light using a phosphor coating.

FIGS. 5a and 5b depict a semiconductor chip system that emits white light. In FIG. 5a, there is a GaN based semiconductor chip 2000 depicted. It includes a GaN system 5001 built on an insulative sapphire substrate 5002 capable of emitting blue light, the general structure of which is known in the prior art. A light conversion layer 5003 such as AlGaInP (aluminum gallium indium phosphate) adjacent the sapphire layer 5002 opposite the GaN system 5001. Light emitted from the GaN system will travel through the sapphire layer 5002, through the AlGaInP 5003 to exit the chip system. Some of the blue light will be absorbed by the AlGaInP to emit yellow light, and some of the blue light will be transmitted through the AlGaInP. The combination of blue and yellow light emitted by the chip according to arrows 5004a, 5004b and 5004c will appear as white light to human eyes. Electrodes 5005 and 5006 are provided for electrical connection. Referring to FIG. 5b, the chip 2000 is depicted following application of an exterior light conversion coating or layer 5007 such as phosphor. Light which exits through the phosphor such as 5004a will be converted in wavelength to white, making a useful light for illuminating physical spaces. A coating or layer to convert monochromatic light to white light may include phosphor powder, YAG/Ce and others. Such a coating or layer may be applied by the methods of brush coating, flow coating and evaporative coating.

Figure 6:
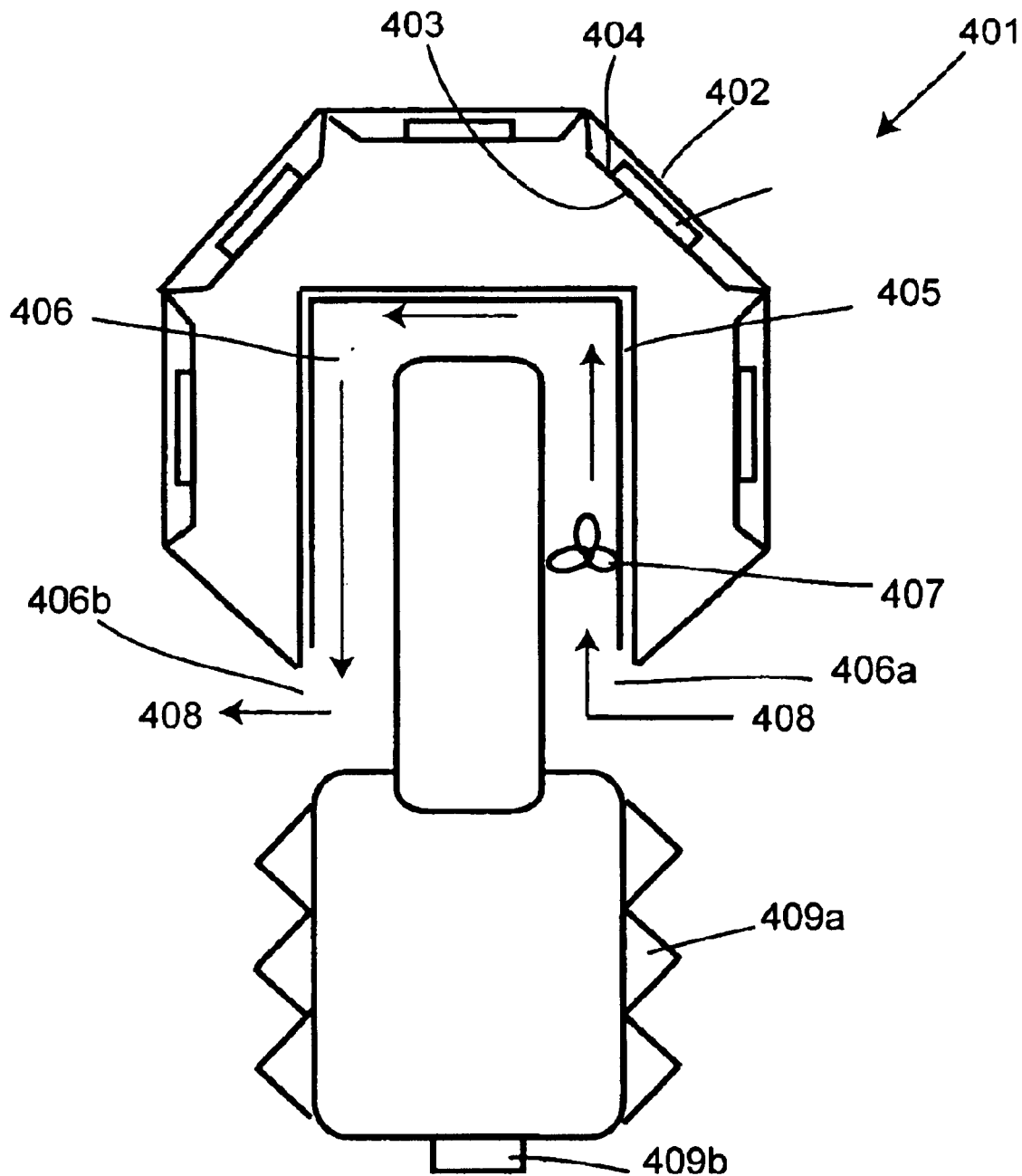
FIG. 6 depicts a cross sectional view of a heat sink of the invention using a fan and TE cooler to circulate air and remove heat.

FIG. 6 depicts a cross sectional view of a heat sink of the invention 401. As depicted in this embodiment, a plurality of semiconductor chips or high power LED"s 402 capable of emitting light are mounted in a well of the heat sink material 403 (surface mounting). The mounting of the chips or high power LED"s may be achieved by use of a heat-conductive adhesive 404, or by brazing or mechanical fixation. The heat sink material 403 is of sufficient thickness to conduct heat away from the chips 402 and keep the chips cool. Located within the heat sink 403, a layer or lining of thermal electric material 405 may be installed. Thermal electric ("TE") material experiences a reduction in temperature when voltage is applied to it. By applying a voltage to the TE material 405, its temperature can be lowered and heat can be drawn from the heat sink material 403 that in turn is drawing heat away from the chips 402. The TE material may line an air chamber 406. The air chamber is open at its entrance 406a and at its exit 406b. A fan 407 may be placed in or near the air chamber 406 in order to cause air 408 to travel in the entrance 406a, through the air chamber 406 past the TE material 405 and out of the exit 406b, carrying heat with it. Such a system will increase efficiency of heat dissipation from the chips 402. At the bottom of the heat sink, a fitting or connector may be provided that is threaded 409a and has an electrode 409b for installation into a traditional light socket.

Figure 7A:
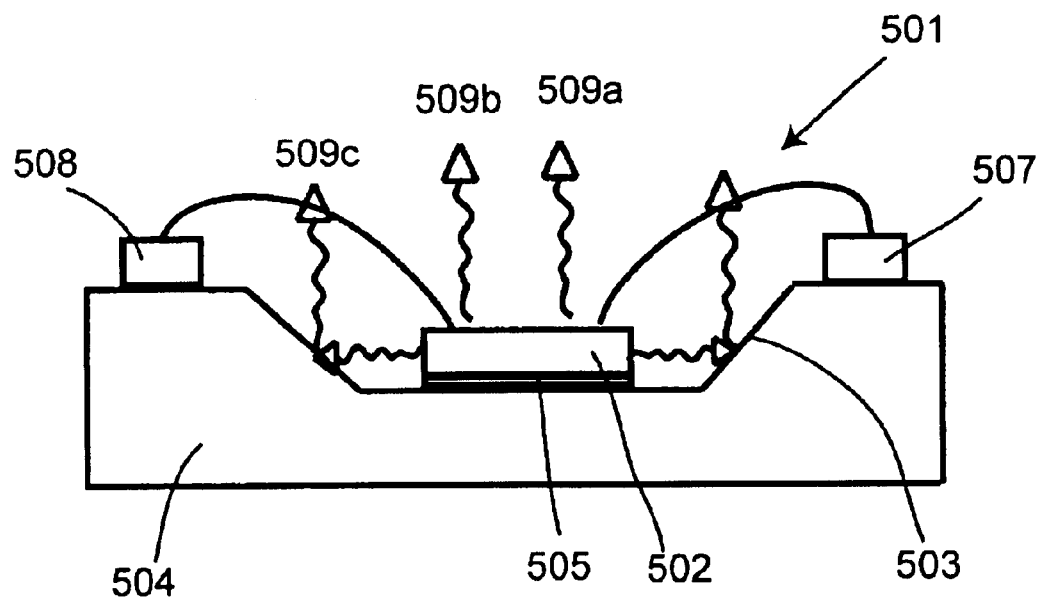
FIG. 7a depicts a single chip or single array chip package.

FIG. 7a depicts a single chip or single array chip surface mount package 501. It includes a semiconductor chip or array 502 capable of emitting light mounted in a well 503 of a heat sink 504. The well 503 is provided with reflective sides to that light emitted from the sides of the chip or array 502 is reflected out of the well in order to provide useful illumination and to minimize heat buildup. The chip or array 502 may be mounted in the well 503 by use of a heat conductive adhesive 505 or by brazing or mechanical fixation. The heat conductive adhesive may also be used as a reflector to reflect light from the substrate in the direction of arrows 509a and 509b. Connection blocks 507 and 508 may be mounted on the heat sink 504 in order to facilitate electrical connection of the chip 502. Light exits the chip as indicated by arrows 509a, 509b and 509c.

Figure 7B:
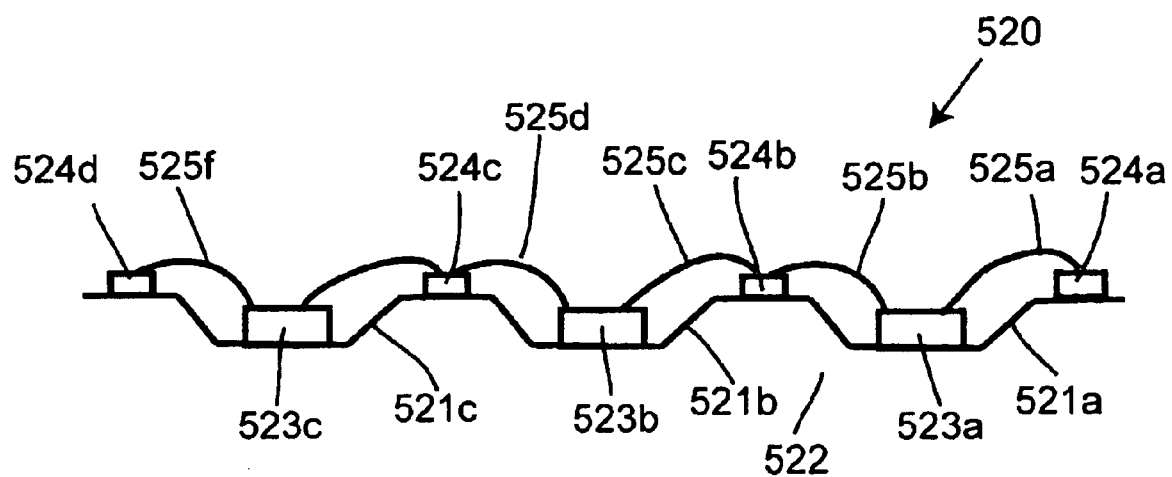
FIG. 7b depicts a multiple chip package.

FIG. 7b depicts a multiple chip package 520. It includes multiple wells 521a, 521b and 521c on a heat sink 522 in which multiple chips or arrays 523a, 523b and 523c are located. Connection blocks 524a, 524b, 524c and 524d are provided with lead wires 525a, 525b, 525c, 525d and 525f in order to electrically power the chips or arrays.

Figure 8A:
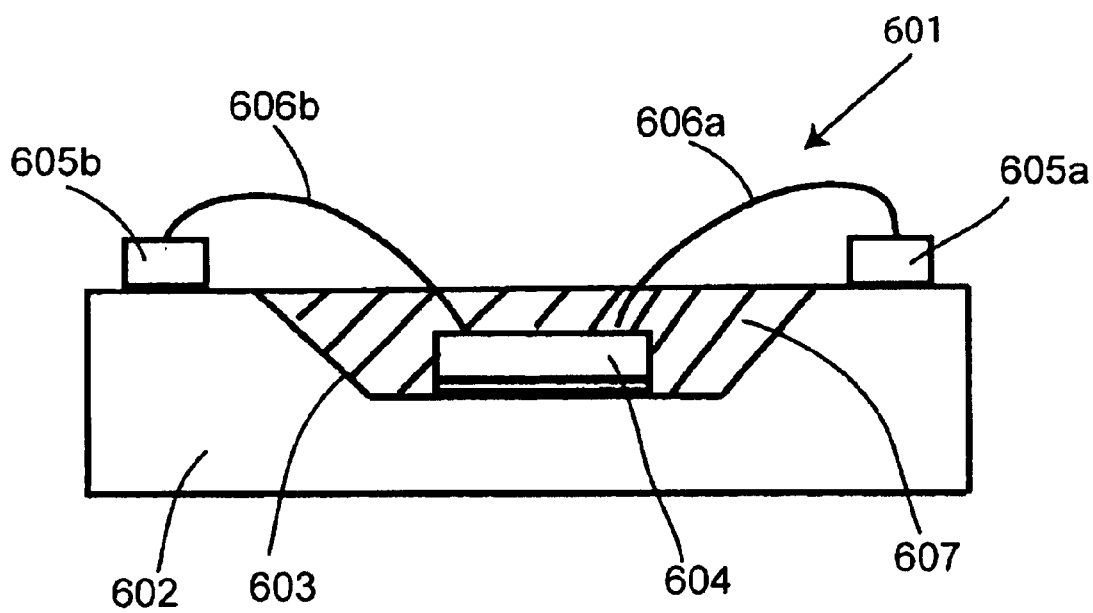
FIG. 8a depicts a chip package with phosphor covering on the semiconductor.
Figure 8B:
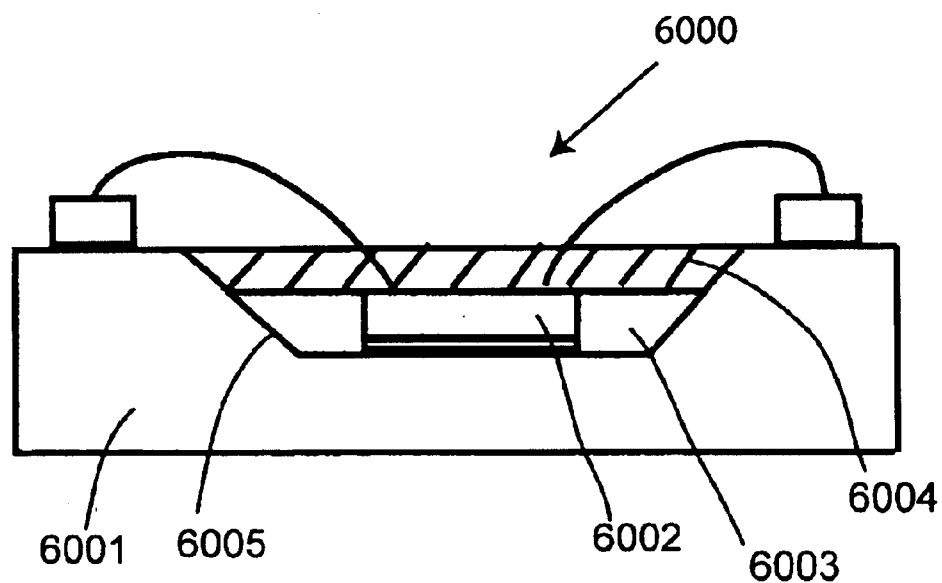
FIG. 8b depicts a chip package with a uniform phosphor coating.

FIG. 8a depicts a chip package with phosphor covering 601. The package includes a heat sink 602 in which a well is located 603 for receiving a chip or array 604. Connection blocks 605a and 605b and lead wires 606a and 606b may be used to electrically power the chip or array 604. A thickness of phosphor 607 may be placed over the chip or array 604 in order to convert single wavelength light emitted from the chip or array into multiple wavelength white light useful for illumination of spaces used by humans. FIG. 8b depicts another phosphor coated chip package 6000. It includes a heat sink 6001 on which a light emitting chip 6002 is mounted in a receptacle 6005 on the heat sink. The chip 6002 does not fill the entirety of the receptacle 6005 so a transparent filler 6003 of a material transparent to the wavelength of light emitted by the chip 6002 is provided. Some transparent materials which may be used include epoxy, plastic and others. On the face of the chip 6002 opposite the heat sink 6001 a wavelength conversion coating or layer 6004 is provided to convert the light emitted by the chip to white light. A phosphor coating is preferred.

Figure 9:
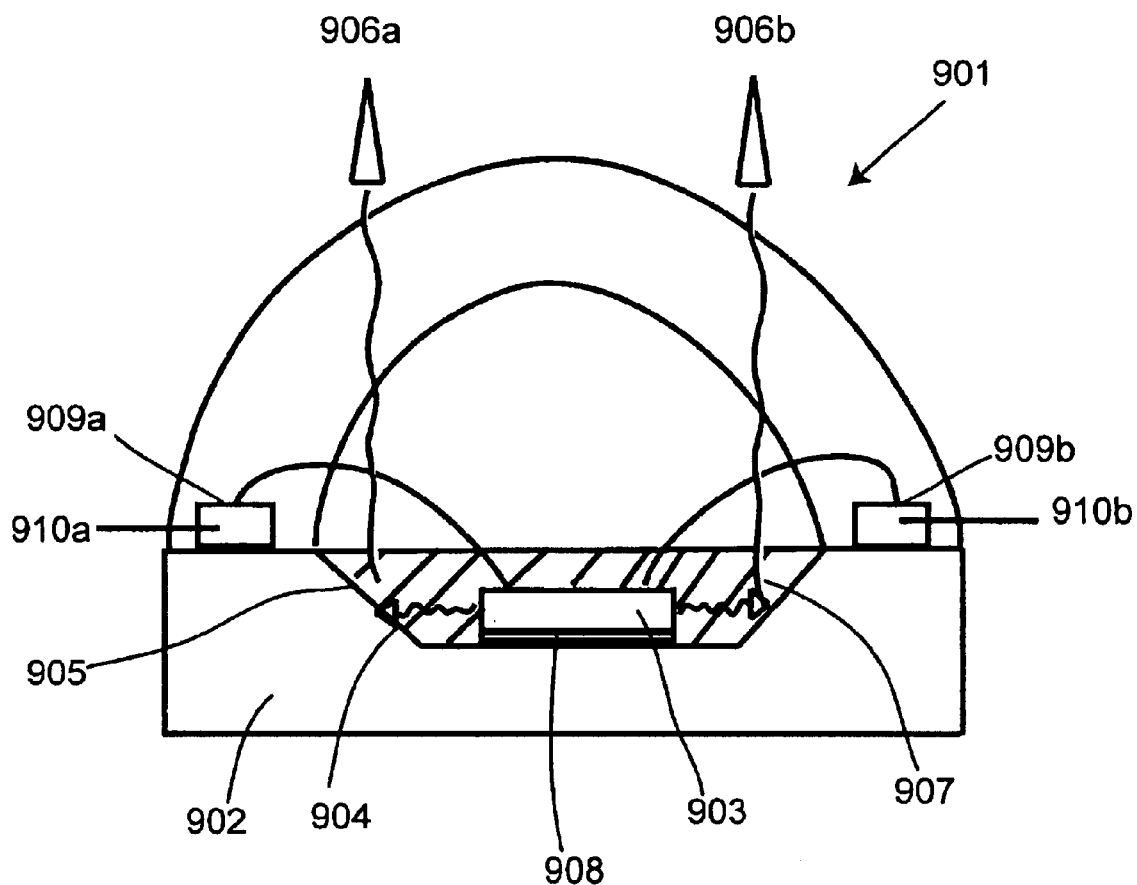
FIG. 9 depicts a high power LED package.

FIG. 9 depicts a high power surface mount LED package 901 useful in the invention. The LED package 901 includes a heat sink 902 formed from a material which can dissipate heat. A well 904 is formed in the heat sink in order to accept an LED, laser diode or semiconductor chip array 903 therein. The well 904 has walls 905 for reflecting light 906a and 906b emitted by the chip(s) 903. An optional phosphor coating 907 is provided over the chip(s) to convert light emitted by the chip(s) to white light. The chip(s) 903 are secured to the heat sink 903 by use of adhesive 908. The adhesive 908 may be heat conductive to aid in transmission of heat from the chips to the heat sink, and it may have light reflective properties to aid in reflection of light from the chips in the direction of arrows 906a and 906b in a usable direction. Reflection of light by the well and the adhesive provides more efficient light output than would otherwise be achieved. Connection blocks 909a and 909b are provided for forming electrical connection with diodes 910a and 910b. A focus dome, lens, or cover 910 is provided that is transparent to the light being emitted. The focus dome may have the characteristic of serving to focus light being emitted from the chips in order to create a substantially coherent beam of usable light.

Figure 10:
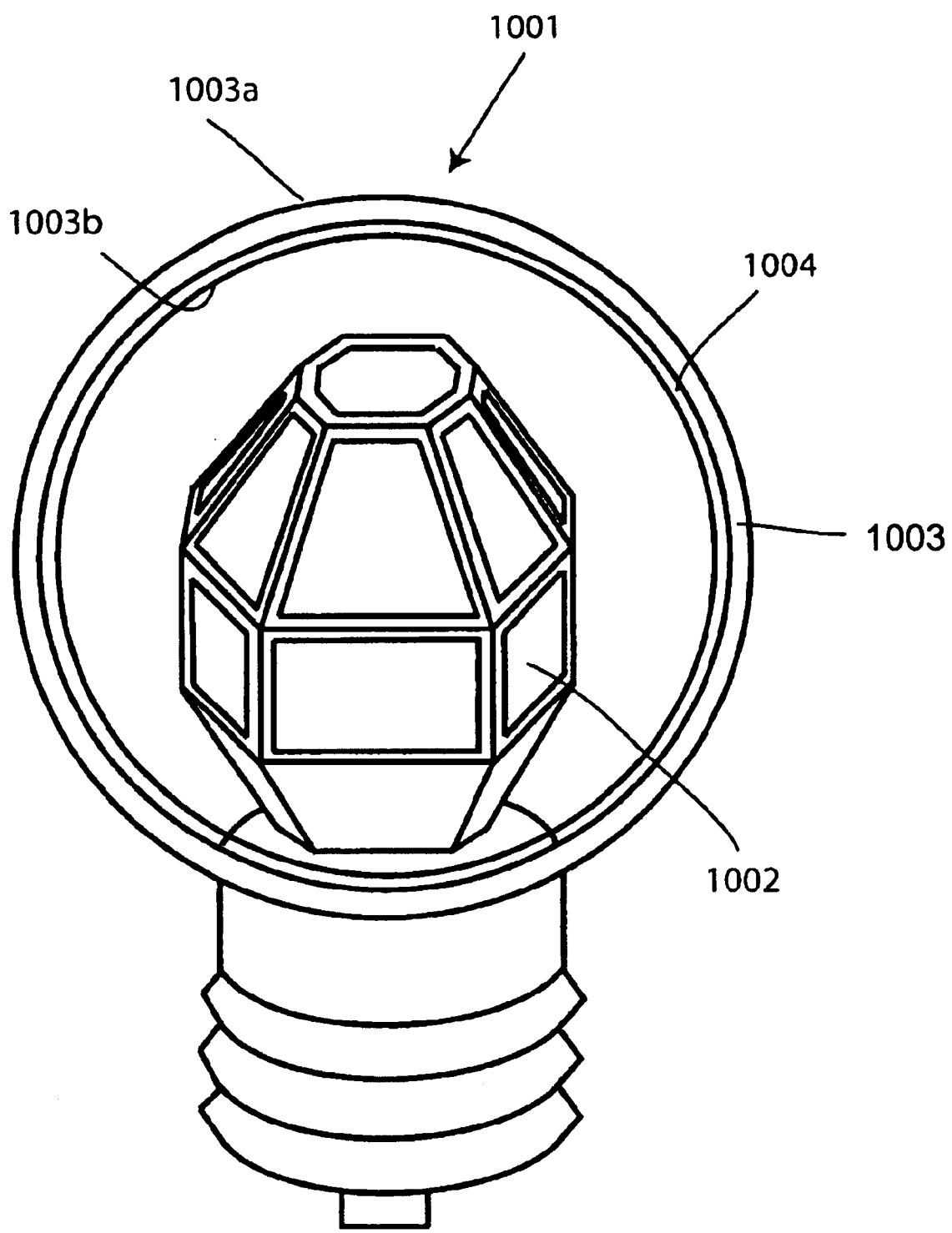
FIG. 10 depicts a LED or laser light source located in a light enclosure having a phosphor coating.

FIG. 10 depicts a light source of the invention 1001 having an LED or laser light source 1002 located in an enclosure 1003. The enclosure may be any appropriate shape. The depicted shape is that of a bulb, but flat, arcuate, rounded or other shapes may be used depending on the application. The enclosure 1003 may be glass, plastic, polycarbonate or any other material that is substantially transparent to the light to be emitted. The enclosure 1003 has an exterior surface 1003a and an interior surface 1003b. The enclosure serves as a protector of the light source 1002 and it may be designed to diffuse light. The interior surface 1003b of the enclosure may have a coating or layer 1004 which serves to alter properties of the light emitted from the light source 1002. For example, if light from the light source 1002 is single wavelength, then the light-altering coating 1004 may be phosphorous which will turn the monochromatic light into white light. Other coatings may be used as desired to alter the light in other ways.

Figure 11:
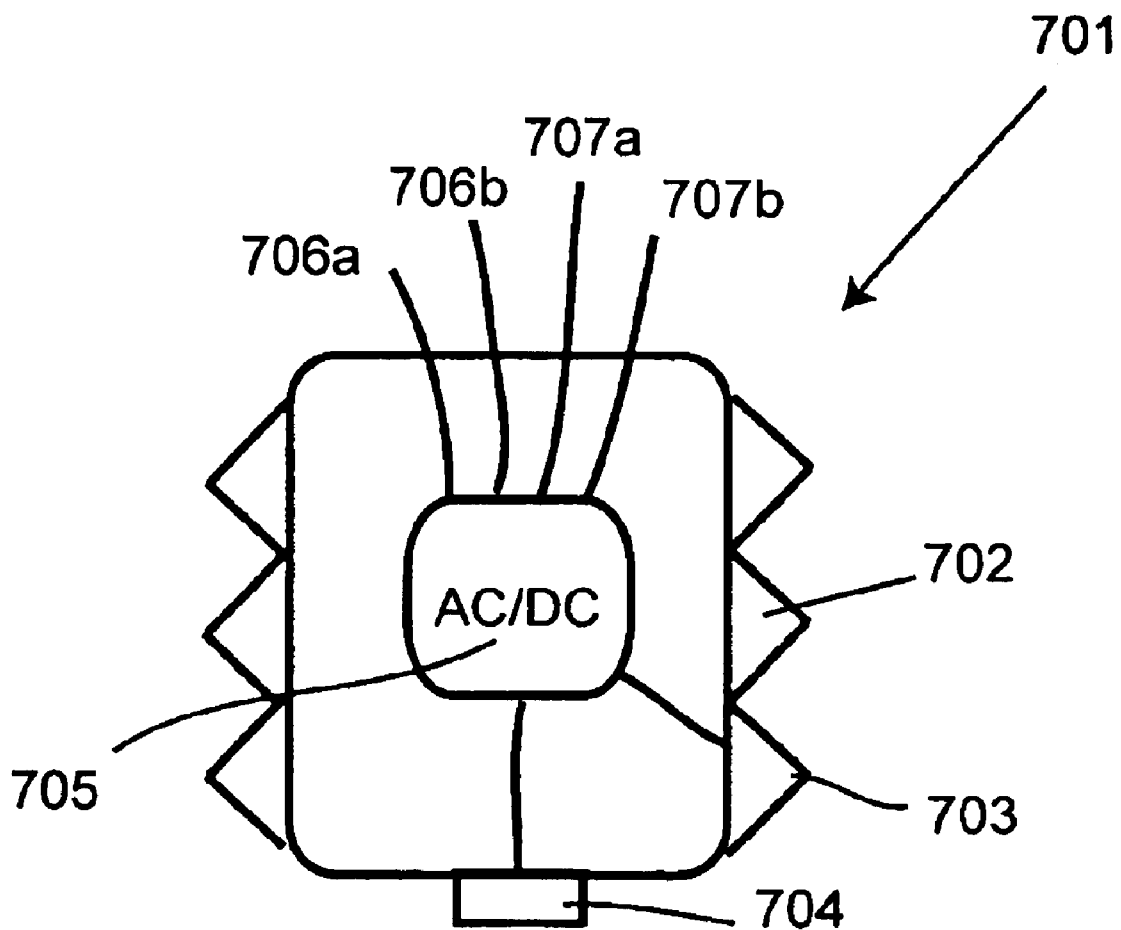
FIG. 11 depicts a power supply module with fitting for a light source of the invention.

FIG. 11 depicts a power supply module 701 for a light source of the invention. The power supply module 701 includes a fitting or connector 702 with electrodes 703 and 704 for receiving AC electrical input from a traditional light bulb socket. An AC/DC converter 705 is provided to convert AC power from standard building wiring into DC power usable by the semiconductor chips of the invention. Electrical lead wires 706a and 706b are provided for electrical connection to the chips to power the light source, and electrical lead wires 707a and 707b are provided to provide power for the cooling fan TE cooler. The coating may be applied on the interior or exterior of the enclosure, or both.

Examples of some heat sink materials which may be used in the invention include copper, aluminum, silicon carbide, boron nitride natural diamond, monocrystalline diamond, polycrystalline diamond, polycrystalline diamond compacts, diamond deposited through chemical vapor deposition and diamond deposited through physical vapor deposition. Any materials with adequate heat conductance can be used.

Examples of heat conductive adhesives which may be used are silver based epoxy, other epoxies, and other adhesives with a heat conductive quality. In order to perform a heat conductive function, it is important that the adhesive possess the following characteristics: (i) strong bonding between the materials being bonded, (ii) adequate heat conductance, (iii) electrically insulative or electrically conductive as desired, and (iv) light reflective as desired. Examples of light reflective adhesives which may be used include silver and aluminum based epoxy.

Examples of substrates on which the semiconductors used in the invention may be grown include Si, GaAs, GaN, InP, sapphire, SiC, GaSb, InAs and others. These may be used for both electrically insulative and electrically conductive substrates.

Materials which may be used to used as a thermoelectric cooler in the invention include known semiconductor junction devices.

It will be preferred that the semiconductor light source of the invention will emit light in the wavelength range of 200 to 700 in order to be useful for illumination of a physical space used by humans.

Heat sinks used in this invention can be of a variety of shapes and dimensions, such as those depicted in the drawings or any others which are useful for the structure of the particular light source being constructed.

Any of the foregoing, including combinations thereof, and other semiconductors, materials and components may be used in the invented light sources.

While the present invention has been described and illustrated in conjunction with a number of specific embodiments, those skilled in the art will appreciate that variations and modifications may be made without departing from the principles of the invention as herein illustrated, as described and claimed. The present invention may be embodied in other specific forms without departing from its spirit or essential characteristics. The described embodiments are considered in all respects to be illustrative and not restrictive. The scope of the invention is, therefore, indicated by the appended claims, rather than by the foregoing description. All changes which come within the meaning and range of equivalence of the claims are to be embraced within their scope.

What is claimed is:

1. A method for making a semiconductor light source intended to be used for emitting light to illuminate a space used by humans, the method comprising:

fabricating an enclosure, said enclosure being fabricated from a material substantially transparent to white light, and said enclosure having an interior volume, fabricating at least one heat sink to be located within said enclosure, said heat sink being shaped to facilitate mounting of semiconductor devices thereon, said heat sink being adapted to draw heat away from semiconductor devices mounted on it, selecting a plurality of semiconductor devices capable of emitting light emitting devices, mounting said semiconductor devices on said heat sink(s), applying a conversion coating for converting monochromatic light emitted by said chips to white light to the interior of said enclosure.

2. A method as recited in claim 1 further comprising the step of applying a light reflective adhesive between said semiconductor device and a heat sink.

3. A method as recited in claim 1 wherein said semiconductor devices are mounted to said heat sink by use of heat conductive adhesive located between said chip and said heat sink and serving to conduct heat from said chip to said heat sink.

4. A method as recited in claim 1 further comprising the step of placing a quantity of light reflective adhesive located between said semiconductor devices and said heat sink.

5. A method as recited in claim 1 wherein said heat sink has an air chamber within it to facilitate air flow and heat dissipation.

6. A method as recited in claim 5 wherein said air chamber has a TE cooler on it.

7. A method as recited in claim 5 further comprising placing a quantity of TE cooler material on the interior of said air chamber.

8. A method as recited in claim 1 wherein at least one of said semiconductor devices includes a substrate on which epitaxial layers are grown, a buffer layer located on said substrate, said buffer layer serving to mitigate differences in material properties between said substrate and other epitaxial layers, a first cladding layer serving to confine electron movement within the chip, said first cladding layer being adjacent said buffer layer, an active layer, said active layer emitting light when electrons jump to a valance state, a second cladding layer, said second cladding layer positioned so that said active layer lies between cladding layers, and a contact layer on which an electron may be mounted for powering said chip.

9. A method for making a semiconductor light source comprising the steps of:

obtaining an enclosure, said enclosure being fabricated from a material substantially transparent to white light, obtaining a base to which said enclosure may be mounted, obtaining a secondary heat sink suitable for being located within said enclosure, said secondary heat sink being capable of drawing heat from one or more semiconductors devices, said secondary heat sink having a plurality of panels on it suitable for mounting primary heat sinks thereon, said panels on said secondary heat sink being oriented to facilitate emission of light from the semiconductor light source in desired directions around the semiconductor light source, obtaining a plurality of primary heat sinks, obtaining a plurality of semiconductor devices, mounting at least one semiconductor device on each of said primary heat sinks by use of a light reflective adhesive, and mounting said primary heat sinks on said secondary heat sink panels.

10. A method as recited in claim 9 wherein said enclosure has a light conversion coating bated on its interior for convert light emitted by said semiconductor devices to white light.

11. A method as recited in claim 9 wherein said heat sink has an air chamber within it to facilitate air flow and heat dissipation.

12. A method as recited in claim 11 wherein said air chamber has a TE cooler on it.

13. A method as recited in claim 9 wherein at least one of said semiconductor devices includes
- a substrate on which epitaxial layers are grown,
- a buffer layer located on said substrate, said buffer layer serving to mitigate differences in material properties between said substrate and other epitaxial layers,
- a first cladding layer serving to confine electron movement within the chip, said first cladding layer being adjacent said buffer layer,
- an active layer, said active layer emitting light when electrons jump to a valance state, and
- a second cladding layer, said second cladding layer positioned so that said active layer lies between cladding layers.

14. A method for making a semiconductor light source comprising the steps of:
- obtaining an enclosure,
- obtaining a heat sink suitable for being located within said enclosure, said heat sink being capable of drawing heat from one or more semiconductors devices,
- obtaining a plurality of light-emitting semiconductor devices, and
- mounting said semiconductor devices on said heat sink by use of a light reflective adhesive.

15. A method for making a semiconductor light source comprising the steps of:
- obtaining an enclosure,
- obtaining a heat sink suitable for being located within said enclosure, said heat sink being capable of drawing heat from one or more semiconductors devices,
- said heat sink having an air chamber within its interior through which air may flow in order to facilitate heat dissipation,
- obtaining a plurality of light-emitting semiconductor devices, and
- mounting said semiconductor devices on said heat sink.

16. A method as recited in claim 15 wherein said enclosure has a light conversion coating located on its interior for converting light emitted by said semiconductor devices to white light.

17. A method as recited in claim 15 wherein said air chamber has a TE cooler on it to facilitate cooling said heat sink.

18. A method as recited in claim 15 wherein at least one of said semiconductor devices includes
- a substrate on which epitaxial layers are grown,
- a buffer layer located on said substrate, said buffer layer serving to mitigate differences in material properties between said substrate and other epitaxial layers,
- a first cladding layer serving to confine electron movement within the chip, said first cladding layer being adjacent said buffer layer,
- an active layer, said active layer emitting light when electrons jump to a valance state, and
- a second cladding layer, said second cladding layer positioned so that said active layer lies between cladding layers.

19. A method as recited in claim 15 further comprising the step of applying a light conversion coating to the interior of said enclosure, said coating being capable of converting monochromatic light to white light.

20. A method for making a semiconductor light source comprising the steps of:
- obtaining an enclosure,
- applying a conversion coating to the interior of said enclosure, said conversion coating being capable of converting a monochromatic light to white light,
- obtaining a heat sink suitable for being located within said enclosure, said heat sink being capable of drawing heat from one or more semiconductors devices,
- said heat sink having an air chamber within its interior through which air may flow in order to facilitate heat dissipation,
- obtaining a plurality of light-emitting semiconductor devices, and mounting said light-emitting semiconductors to said heat sink by use of a light-reflective adhesive.

21. A method for making a semiconductor light source comprising the steps of:
- obtaining a secondary heat sink suitable for being located within an enclosure, an secondary heat sink being capable of drawing heat from one or more semiconductors devices,
- said secondary heat sink having an air chamber within its interior through which air may flow in order to facilitate heat dissipation,
- obtaining a plurality of primary heat sinks,
- obtaining a plurality of light-emitting semiconductor devices,
- mounting said light-emitting semiconductors to said primary heat sinks by use of a light-reflective adhesive,
- mounting said primary heat sinks to said secondary heat sink,
- forming an enclosure,
- applying a conversion coating to the interior of said enclosure, said conversion coating
- being capable of converting a monochromatic light to white light, and
- locating said secondary heat sink within said enclosure.

22. A semiconductor light source for providing illumination visible to humans of a physical space used by humans semiconductor light source being made in accordance with the process of claim 1, 9, 13, 14, 15, 18, 20 or 21.

* * * * *